Oct. 27, 1964 L. G. WILEY 3,154,694

PULSE GENERATOR EMPLOYING TRIGGERABLE SOLID STATE SWITCHES

Filed Dec. 4, 1961 2 Sheets-Sheet 1

INVENTOR.
LAWRENCE G. WILEY

BY

Curtis, Morris + Safford

PULSE GENERATOR EMPLOYING TRIGGERABLE SOLID STATE SWITCHES

Filed Dec. 4, 1961 2 Sheets-Sheet 2

INVENTOR.
LAWRENCE G. WILEY
BY
Curtis, Morris & Safford

United States Patent Office 3,154,694
Patented Oct. 27, 1964

3,154,694

PULSE GENERATOR EMPLOYING TRIGGERABLE SOLID STATE SWITCHES

Lawrence G. Wiley, Camp Hill, Pa., assignor to AMP Incorporated, Harrisburg, Pa.

Filed Dec. 4, 1961, Ser. No. 156,616
5 Claims. (Cl. 307—88.5)

This invention relates to an improved pulse generator.

A primary object of this invention is to provide an improved high speed pulse generator.

A further object of this invention is to provide a high speed pulse generating circuit of inexpensive low tolerance components operable with non-critical voltage requirements.

A particular object of invention is to provide a push-pull pulse generator employing four-layer diodes but avoiding diode "rate" effect.

In FIGURE 5 there is described a type of power supply employing four-layer diodes to controllably switch the charging and discharging of a single capacitor through a pulse forming network to form distinct output pulses. The circuit of this prior approach has proven highly successful in that it is less expensive and more reliable than prior known circuits of the same capability. The present application represents an improvement on the circuit of FIGURE 5 which is even less expensive and more reliable and additionally, capable of a high cyclic pulse output. The present invention accomplishes this by eliminating the so called "rate" or "*dv/dt*" effect which reduces the rated switching voltage of four-layer diodes. While the circuit of FIGURE 5 is used to outline the problem of "rate" effect, it is to be understood that the circuit and technique of the present invention has application in other four-layer diode circuits.

In any circuit employing solid state four-layer diodes as switches, the initial circuit consideration is the diode rating i.e., that point of applied voltage at which the diode enters its avalanche voltage region and switches. Circuit components and applied voltages must be chosen with this rating in mind. A further consideration involves the four-layer diode "*dv/dt*" effect which results in an apparent decrease of the diode switching voltage as a function of the rate of change of the voltage applied to the diode. The practical effect of this is that variations in supply voltage, triggering voltage and circuit components must be limited so that individual or complementary variations cannot result in an applied diode voltage less than the lowest apparent voltage possible with the components and voltages employed. The alternative to this is a reduction in operating speed. As is well understood, the cost of components and voltage supplies is directly proportional to the permissable variation in operating range or tolerance. Therefore, in circuits employing four-layer diodes, such as the circuit in FIGURE 5, the components and voltage supply must be of a high tolerance, high cost variety.

The present invention includes an additional circuit path which minimizes variations in the switching voltage of four layer diodes utilized in the circuit, thereby eliminating diode rate effect. The circuit of the present invention may therefore be comprised of components of lower cost. Furthermore, the supply and trigger voltages may vary within broader limits without mis-triggering the diodes with an incidental saving of voltage equipment cost and in increased circuit reliability. Finally, by avoiding the diode rate effect the circuit of the present invention is capable of a higher rate of triggering voltage application and hence of pulse output frequency.

Other objects and attainments of the present invention will become apparent to those skilled in the art upon a reading of the following detailed description when taken in conjunction with the drawings in which there is shown and described an illustrative embodiment of the invention; it is to be understood, however, that this embodiment is not intended to be exhaustive nor limiting of the invention but is given for purposes of illustration in order that others skilled in the art may fully understand the invention and the principles thereof and the manner of applying it in practical use so that they may modify it in various forms, each as may be best suited to the conditions of a particular use.

For purpose of understanding the problem solved by the present invention, reference will first be made to FIGURE 5, followed by detailed description of the circuits exemplifying the present invention.

Figure 4:
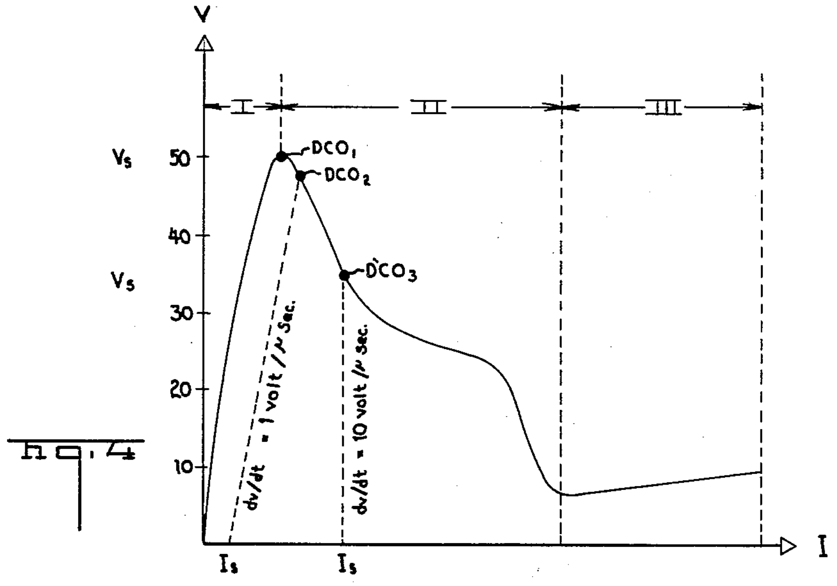
FIGURE 4 is a typical four-layer diode *dv/dt* voltage current characteristic curve.
Figure 5:
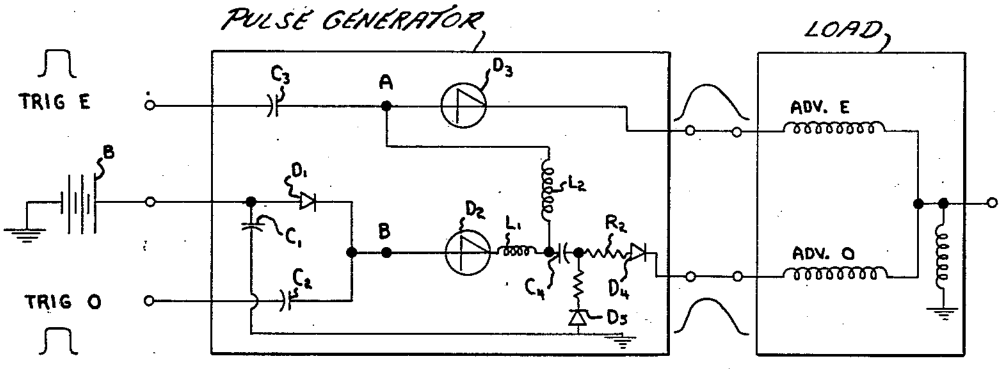
FIG. 5 PRIOR ART
FIGURE 5 is a circuit included to represent the prior art.

In FIGURE 5 it will be apparent that upon charging, the capacitor $C_4$ places a voltage on four-layer diode $D_3$ varying from approximately zero volts to the full voltage of battery B or slightly above due to the inductance $L_1$. If battery B is 40 volts, and the capacitor $C_4$ charges in four microseconds, then the *dv/dt* applied to diode $D_3$ is 10 volts per microsecond. Conversely, upon discharge of capacitor $C_4$, a *dv/dt* of 10 volts per microsecond will be applied to diode $D_2$ Referring now to FIGURE 4, the *dv/dt* voltage-current characteristic of a typical four-layer diode is shown for a diode rated at 50 volts. In the region I, the diode appears to be a single back biassed diode. Upon passing point $DCO_1$ the diode avalanche voltage is reached and the diode behaves as a negative resistance with increasing current causing the voltage to drop as shown. Further current application causes the diode to reach the region III and act as a forward biased diode. The *dv/dt* effect alters the operation of the four-layer diode by shifting the region I to the right with each increase in the applied voltage per unit of time. The *dv/dt* effect may be explained by considering the current flow through the diode as being comprised of two current components; one representing the pure resistive current flow and the other representing the capacitive current flow. The capacitive current component may be said to equal $$C\left(\frac{dv}{dt}\right)$$

wherein C represents the device capacitance. Thus it is that as *dv/dt* increases, the apparent current flowing through the four-layer diode also increases, and the point $DCO_1$, representing the rated D.-C. switching voltage, moves down the curve. The switching voltage is thus reduced by a substantial amount as indicated by ($V_S$). For example, with a *dv/dt* of 1 volt per microsecond the switching voltage of the diode is apparently 47 volts or the point $DCO_2$ in FIGURE 4 and with a *dv/dt* of 10 volts per microsecond, the apparent switching voltage is 35 volts or $DCO_3$. The effect of this is that with a voltage applied to the diodes $D_2$ and $D_3$ of the prior mentioned application changing at 1 volt per microsecond the diodes will switch at 47 volts and with a change of 10 volts per microsecond the diodes will switch at 35 volts.

It will be apparent that a variation in either the voltage supply B, the diode triggering pulses or variations in the operating characteristics of other components in the circuit of FIGURE 5 may produce a condition wherein the diodes $D_2$ and $D_3$ could conduct at an improper time. If either of the diodes were to conduct while the other diode was conducting, the low resistance path resulting through the diodes and load to ground would assure a continued conduction of both diodes and the circuit would mal-function with the likelihood of eventual component failure.

It is to be understood that the device of FIGURE 5 is used to exemplify the problem present with four-layer diodes and that the circuit of FIGURE 5 works satisfactorily as long as close tolerance components are employed and the supply voltage is limited to a value below the apparent switching voltage possible with the charging and discharging rate of the capacitor $C_4$.

Figure 1:
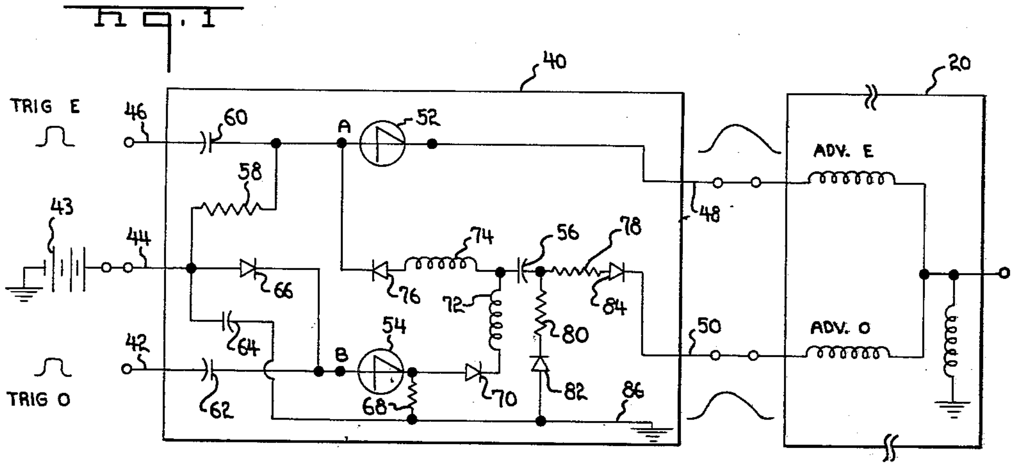
FIGURE 1 is a schematic diagram of the circuit of the invention.

Referring now to the present invention, FIGURE 1 shows a pulse generator 40 connected to a load 20. The load 20 represents a primarily inductive impedance requiring a series of spaced pulses applied to the load input terminals having a pulse shape as generally indicated by the pulses depicted. The magnetic core shift register shown in Patent No. 2,995,731, represents this type of load. The pulse generator 40 is operated to produce a series of spaced pulses responsive to alternatively fed trigger pulses on inputs 42 and 46 which may be fractional microsecond square wave positive pulses provided by any suitable source. The general operation of unit 40 calls for the timed conduction of four-layer diodes 54 and 52 to alternately charge capacitor 56 forming an output pulse on terminal 50 and discharge capacitor 56 forming an output pulse on terminal 48; the output pulses being shaped by the LCR circuit comprised of elements 72, 74, 56, 78 and 80. Prior to the application of trigger pulses, the unit 40 is at rest with the diodes 54 and 52 non-conducting and the capacitor 56 uncharged. The switching voltage of diode 54 should be greater than the voltage of battery 43 so that to initiate operation, a positive pulse Trig. O must be applied to input terminal 42 of a voltage sufficient to combine with the output of battery 43 to exceed the switching voltage of diode 54 and cause diode 54 to conduct. Conduction of diode 54 charges capacitor 56 through a path including rectifiers 66 and 70, inductor 72, resistor 78, rectifier 84, the terminal 50 and the ADVANCE O terminal to ground to generate an output pulse to the load. Upon the occurrence of Trig. E, the diode 52 conducts discharging the capacitor 56 through a path including rectifier 82, resistor 80, inductor 74, rectifier 76 and the ADVANCE E terminal to ground to generate a second output pulse.

Capacitors 60 and 62 are included in the path between the Trig. E and Trig. O sources and the respective four-layer diodes and capacitor 64 is included between the application of battery to the diodes and ground.

Figure 2:
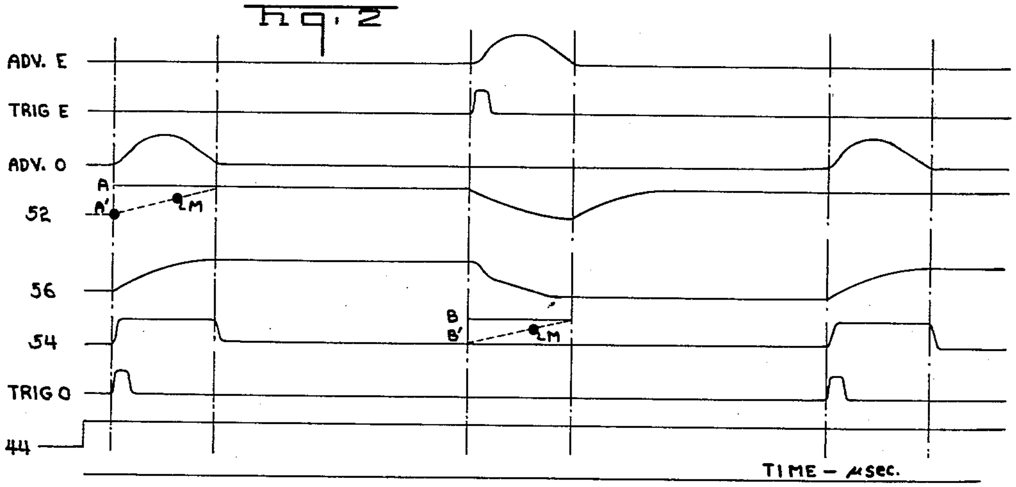
FIGURE 2 is a pulse-voltage-time diagram of the operation of the principal components of the invention.

Referring now to FIGURE 2, the foregoing operation is depicted with the operation of the circuit components represented by curves labeled as indicated. It will be apparent that following the application of the Trig. O pulse, the current of diode 54 rises to a maximum value and continues for a period of several microseconds as determined by the charging rate of capacitor 56. The capacitor 56 charges to a voltage slightly higher than that of the battery 43 due to the inductive effect of the circuit thereby back biasing diode 70 to cutoff and returning 54 to ground through 68. The curve "ADV. O" represents the output pulse from the unit 40 following the application of the Trig. O input pulse. The capacitor 56 remains charged until the application of the Trig. E pulse on terminal 46 operates to cause diode 52 to conduct, thus opening a path for the discharge of the capacitor 56 to generate the ADV. E pulse as heretofore described. As the curve of FIGURE 2 indicates, the application of Trig. E causes diode 52 conduction to continue until the capacitor 56 is discharged (the discharge actually drops the voltage slightly below the original source voltage due to the inductive effect of inductance 74).

Assuming that the resistor 58 were not included in the circuit, it will be apparent that upon charging, the capacitor 56 will place a voltage changing at a rate from zero to maximum capacitor voltage as indicated by the line A′ of curve "52" in FIGURE 2, and that discharge of capacitor 56 will similarly place a changing voltage on diode 54 in the manner indicated by the line B′ in curve "54" of FIGURE 2. It will thus be apparent that without the inclusion of the path represented by resistor 58, the diodes 52 and 54 would be subjected to a $dv/dt$ effect equal to a value slightly larger than the supply voltage 43, divided by the charging time of the capacitor 56 and could possibly conduct improperly as indicated by points $m$. Inclusion of the path connecting resistor 58 between the input terminal 44 and the diode 52 input maintains the diode applied voltage at that of source 43 as indicated by the line A in the curve "52" of FIGURE 2. The resistance of 58 should be sufficiently large as to prevent a holding current through diode 52. Upon discharging there is no voltage change on the diode 54 because the diode 54 is effectively turned off by the resulting reverse bias due to the charge on capacitor 56 and returned to ground through resistance 68. The diode 76 prevents the capacitor 56 from charging through a path including the resistor 58. It will thus be apparent that the diodes 52 and 54 are not effected by the changing voltage due to the charging and discharging of capacitor 56 and thus do not experience the $dv/dt$ effect. This means that the diodes and other components may have a manufacturing tolerance much broader than in the circuit heretofore discussed. Additionally, since the diodes 52 and 54 are not subject to the $dv/dt$ effect, the charging rate of capacitor 56 and the application of trigger pulses may be increased without increasing the rate of voltage applied to the diodes and thereby reducing their apparent switching voltage to a point wherein voltage fluxuation could cause the circuit mal-function in the manner heretofore described.

Figure 3:
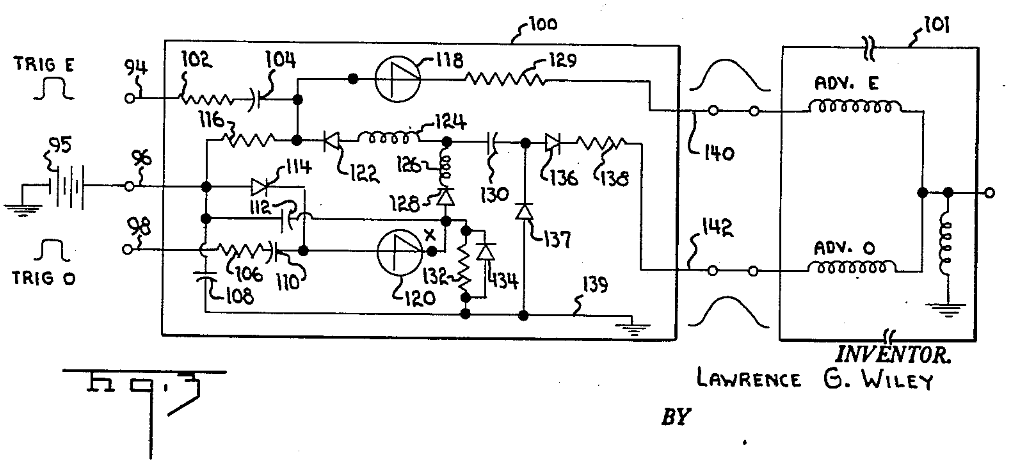
FIGURE 3 is a second embodiment of the circuit of the invention adapted for use with high impedance loads.

The pulse generator 100, shown in FIGURE 3, represents a second embodiment of the circuit of the invention having utility with high impedance loads. The circuit of this embodiment is adaptable specifically for high impedance loads such as a 50 bit 100 core shift register. The operation of the unit 100 is similar to that of the circuit heretofore described with the inclusion of several additional features.

The resistors 102 and 106 placed in the trigger input paths are included to provide isolation in situations where numbers of units 100 are placed in parallel and triggered from a common source of positive pulses. The resistors 129 and 138 improve the impedance match between 100 and the load 101. It has been discovered that with high impedance loads, such as long bit length magnetic core shift registers, a high back voltage feeds back through the terminal, back bias diodes 136 and 128 and permits the back voltage to act as a negative trigger on the diode at point X as indicated in FIGURE 3. With the voltage supply 95 applied to the input side of diode 120, the presence of a negative voltage pulse at point X could cause the diode to conduct. The provision of capacitor 112 and diode 134 serves to delay the return to ground of diode 120 following cutoff after the charging of capacitor 130. Capacitor 112 being charged by the supply voltage after the conduction of 120 represents a positive voltage tending to cushion the reflected negative pulse and diode 134 acts as a shunt to ground around 132 in the presence of a negative pulse. The production of an output pulse on 142 and an incident reflected pulse, acting as a negative trigger at point X, will thus be damped and in effect will reduce the potential at point X at a time when there is no path available for conduction of the diode 120. The circuit of FIGURE 3 thus comprises a pulse generator of board utility capable of use with high impedance loads.

The following is included by way of example to show the relative parameters of the components of the invention. In an actual unit constructed to supply advance pulses for a 55 bit 5 kc. shift register, the circuit of FIGURE 3 included the following components:

| Unit: | Value |
|---|---|
| Resistors **102** and **106** | 4.7Kω½ w. |
| Resistors **138** and **129** | 35ω5 w. |
| Resistors **116** and **132** | 68Kω1 w. |
| Inductances **124** and **126** | 15μh. |
| Capacitors **104**, **110** and **112** | 300μμf. |
| Diodes **114**, **122**, **128**, **134**, **137** and **136** | No. 5A2 International Rectifier Corp. |
| Capacitor **108** | 2μF. |
| Diodes **118** and **120** | Shockley No. 4E 200 M-28. |

The voltage supply 95 was 160 volts, and the Trig. E and Trig. O input pulses were positive square wave fractional microsecond pulses of approximately 10 volts amplitude. The unit 100 produced an output pulse having 1.5 microsecond rise time and 4 microsecond fall time with an amplitude of approximately 2.2 amperes. The actual unit was operated to produce output pulses at a frequency at about 10 kc. without circuit mal-function.

Changes in construction will occur to those skilled in the art and various apparently different modifications and embodiments may be made without departing from the scope of the invention. The matter set forth in the foregoing description and accompanying drawings is offered by way of illustration only. The actual scope of the invention is intended to be defined in the following claims when viewed in their proper perspective against the prior art.

I claim:

1. An electronic circuit comprising a pair of solid state switches connected to be alternatively driven to conduction, each switch having a switching voltage diminished by the rate of applied voltage; a pulse forming network in circuit with said switches and responsive to conduction thereof to produce circuit output pulses; first means connected between switch inputs to maintain the voltage applied to one of said switches relatively constant during the conduction of the other of said switches and second means connected to said other switch to maintain the voltage applied thereto relatively constant during conduction of said one switch.

2. The circuit of claim 1 including third means connected to the output of said other switch for maintaining said switch output temporarily positive following conduction.

3. The circuit of claim 1 including fourth means connected to said second means for shunting said second means in the presence of negative pulses.

4. The circuit of claim 1 wherein the said second means includes a relatively high resistance path to ground and including means for delaying the return of said other switch to ground through said path following conduction thereof.

5. A pulse generator comprising in circuit a first and a second four-layer diode each connected to a potential source by different impedance paths and each connected to individual triggering pulse sources, the said diodes having a switching voltage less than the sum of the potential and one of said pulse sources; a capacitor connected to be charged by the conduction of said first diode and discharged by the conduction of said second diode; a pulse forming network including said capacitor connected to generator output terminals; the charging and discharging of said capacitor producing output pulses on said terminals; means connected in said diode circuits to prevent the presence of a changing voltage at the non-conducting diode during the charging and discharging of said capacitor including a path between said potential source and said first diode and a path between said second diode and ground.

References Cited in the file of this patent

UNITED STATES PATENTS

| | | |
|---|---|---|
| 2,743,360 | Stanton et al. | Apr. 24, 1956 |
| 3,053,999 | Baudin | Sept. 11, 1962 |